(12) United States Patent
Sapre et al.

(10) Patent No.: US 9,012,302 B2
(45) Date of Patent: Apr. 21, 2015

(54) INTRENCH PROFILE

(71) Applicant: Applied Materials, Inc., Santa Clara, CA (US)

(72) Inventors: Kedar Sapre, San Jose, CA (US); Nitin Ingle, San Jose, CA (US); Jing Tang, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 14/484,152

(22) Filed: Sep. 11, 2014

(65) Prior Publication Data

US 2015/0031211 A1     Jan. 29, 2015

Related U.S. Application Data

(62) Division of application No. 13/624,724, filed on Sep. 21, 2012.

(60) Provisional application No. 61/539,279, filed on Sep. 26, 2011.

(51) Int. Cl.
    *H01L 21/76*          (2006.01)
    *H01L 21/3065*      (2006.01)
    *H01L 21/308*       (2006.01)

(52) U.S. Cl.
    CPC ........ *H01L 21/3065* (2013.01); *H01L 21/3081* (2013.01)

(58) Field of Classification Search
    None
    See application file for complete search history.

(56) References Cited

U.S. PATENT DOCUMENTS

| | | | |
|---|---|---|---|
| 2,369,620 | A | 2/1945 | Sullivan et al. |
| 3,451,840 | A | 6/1969 | Hough |
| 3,937,857 | A | 2/1976 | Brummett et al. |
| 4,006,047 | A | 2/1977 | Brummett et al. |

(Continued)

FOREIGN PATENT DOCUMENTS

| | | |
|---|---|---|
| CN | 1375575 | 10/2002 |
| CN | 1412861 A | 4/2003 |

(Continued)

OTHER PUBLICATIONS

Abe et al., "Developments of plasma etching technology for fabricating semiconductor devices," Jpn. J. Appl. Phys., vol. 47, No. 3R, Mar. 2008, 21 pgs.

(Continued)

*Primary Examiner* — Cheung Lee
(74) *Attorney, Agent, or Firm* — Kilpatrick Townsend & Stockton LLP

(57) ABSTRACT

A method of etching a recess in a semiconductor substrate is described. The method may include forming a dielectric liner layer in a trench of the substrate where the liner layer has a first density. The method may also include depositing a second dielectric layer at least partially in the trench on the liner layer. The second dielectric layer may initially be flowable following the deposition, and have a second density that is less than the first density of the liner. The method may further include exposing the substrate to a dry etchant, where the etchant removes a portion of the first liner layer and the second dielectric layer to form a recess, where the dry etchant includes a fluorine-containing compound and molecular hydrogen, and where the etch rate ratio for removing the first dielectric liner layer to removing the second dielectric layer is about 1:1.2 to about 1:1.

16 Claims, 6 Drawing Sheets

(56) References Cited

U.S. PATENT DOCUMENTS

| | | |
|---|---|---|
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,364,803 A | 12/1982 | Nidola et al. |
| 4,368,223 A | 1/1983 | Kobayashi et al. |
| 4,397,812 A | 8/1983 | Mallory, Jr. |
| 4,468,413 A | 8/1984 | Bachmann |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,625,678 A | 12/1986 | Shioya et al. |
| 4,632,857 A | 12/1986 | Mallory, Jr. |
| 4,656,052 A | 4/1987 | Satou et al. |
| 4,690,746 A | 9/1987 | McInerney et al. |
| 4,714,520 A | 12/1987 | Gwozdz |
| 4,749,440 A | 6/1988 | Blackwood et al. |
| 4,753,898 A | 6/1988 | Parrillo et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,851,370 A | 7/1989 | Doklan et al. |
| 4,865,685 A | 9/1989 | Palmour |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,994,404 A | 2/1991 | Sheng et al. |
| 5,000,113 A | 3/1991 | Wang et al. |
| 5,013,691 A | 5/1991 | Lory et al. |
| 5,030,319 A | 7/1991 | Nishino et al. |
| 5,061,838 A | 10/1991 | Lane et al. |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,186,718 A | 2/1993 | Tepman et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,527 A | 9/1993 | Uchida et al. |
| 5,252,178 A | 10/1993 | Moslehi |
| 5,266,157 A | 11/1993 | Kadomura |
| 5,270,125 A | 12/1993 | America et al. |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,290,382 A | 3/1994 | Zarowin et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,316,804 A | 5/1994 | Tomikawa et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,334,552 A | 8/1994 | Homma |
| 5,345,999 A | 9/1994 | Hosokawa |
| 5,352,636 A | 10/1994 | Beinglass |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,468,342 A | 11/1995 | Nulty et al. |
| 5,474,589 A | 12/1995 | Ohga et al. |
| 5,478,403 A | 12/1995 | Shinagawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,571,576 A | 11/1996 | Qian et al. |
| 5,578,130 A | 11/1996 | Hayashi et al. |
| 5,591,269 A | 1/1997 | Arami et al. |
| 5,599,740 A | 2/1997 | Jang et al. |
| 5,624,582 A | 4/1997 | Cain |
| 5,626,922 A | 5/1997 | Miyanaga et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,674,787 A | 10/1997 | Zhao et al. |
| 5,679,606 A | 10/1997 | Wang et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,755,859 A | 5/1998 | Brusic et al. |
| 5,756,402 A | 5/1998 | Jimbo et al. |
| 5,781,693 A | 7/1998 | Ballance et al. |
| 5,786,276 A | 7/1998 | Brooks et al. |
| 5,789,300 A | 8/1998 | Fulford |
| 5,800,686 A | 9/1998 | Littau et al. |
| 5,804,259 A | 9/1998 | Robles |
| 5,812,403 A | 9/1998 | Fong et al. |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,838,055 A | 11/1998 | Kleinhenz et al. |
| 5,843,538 A | 12/1998 | Ehrsam et al. |
| 5,844,195 A | 12/1998 | Fairbairn et al. |
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,872,052 A | 2/1999 | Iyer |
| 5,872,058 A | 2/1999 | Van Cleemput et al. |

(56) References Cited

U.S. PATENT DOCUMENTS

| | | |
|---|---|---|
| 5,882,786 A | 3/1999 | Nassau et al. |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,904,827 A | 5/1999 | Reynolds |
| 5,907,790 A | 5/1999 | Kellam |
| 5,910,340 A | 6/1999 | Uchida et al. |
| 5,913,140 A | 6/1999 | Roche et al. |
| 5,913,147 A | 6/1999 | Dubin et al. |
| 5,915,190 A | 6/1999 | Pirkle |
| 5,920,792 A | 7/1999 | Lin |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,902 A | 8/1999 | Redeker et al. |
| 5,951,601 A | 9/1999 | Lesinski et al. |
| 5,951,776 A | 9/1999 | Selyutin et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,004,884 A | 12/1999 | Abraham |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,227 A | 6/2000 | Yau et al. |
| 6,077,780 A | 6/2000 | Dubin |
| 6,080,529 A | 6/2000 | Ye et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,812 B1 | 1/2001 | Hsiung et al. |
| 6,176,198 B1 | 1/2001 | Kao et al. |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,217,658 B1 | 4/2001 | Orczyk et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,752 B1 | 8/2001 | Chen |
| 6,277,763 B1 | 8/2001 | Kugimiya et al. |
| 6,281,135 B1 | 8/2001 | Han et al. |
| 6,291,282 B1 | 9/2001 | Wilk et al. |
| 6,291,348 B1 | 9/2001 | Lopatin et al. |
| 6,303,418 B1 | 10/2001 | Cha et al. |
| 6,312,995 B1 | 11/2001 | Yu |
| 6,313,035 B1 | 11/2001 | Sandhu et al. |
| 6,319,387 B1 | 11/2001 | Krishnamoorthy et al. |
| 6,323,128 B1 | 11/2001 | Sambucetti et al. |
| 6,335,261 B1 | 1/2002 | Natzle et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| 6,344,410 B1 | 2/2002 | Lopatin et al. |
| 6,350,320 B1 | 2/2002 | Sherstinsky et al. |
| 6,351,013 B1 | 2/2002 | Luning et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,372,657 B1 | 4/2002 | Hineman et al. |
| 6,375,748 B1 | 4/2002 | Yudovsky et al. |
| 6,379,575 B1 | 4/2002 | Yin et al. |
| 6,383,951 B1 | 5/2002 | Li |
| 6,387,207 B1 | 5/2002 | Janakiraman et al. |
| 6,395,150 B1 | 5/2002 | Van Cleemput et al. |
| 6,403,491 B1 | 6/2002 | Liu et al. |
| 6,416,647 B1 | 7/2002 | Dordi et al. |
| 6,432,819 B1 | 8/2002 | Pavate et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,462,371 B1 | 10/2002 | Weimer et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,500,728 B1 | 12/2002 | Wang |
| 6,503,843 B1 | 1/2003 | Xia et al. |

(56) References Cited

U.S. PATENT DOCUMENTS

| | | |
|---|---|---|
| 6,506,291 B2 | 1/2003 | Tsai et al. |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,531,377 B2 | 3/2003 | Knorr et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,743,473 B1 | 6/2004 | Parkhe et al. |
| 6,743,732 B1 | 6/2004 | Lin et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,772,827 B2 | 8/2004 | Keller et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,858,153 B2 | 2/2005 | Bjorkman et al. |
| 6,867,141 B2 | 3/2005 | Jung et al. |
| 6,869,880 B2 | 3/2005 | Krishnaraj et al. |
| 6,878,206 B2 | 4/2005 | Tzu et al. |
| 6,879,981 B2 | 4/2005 | Rothschild et al. |
| 6,893,967 B1 | 5/2005 | Wright et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,942,753 B2 | 9/2005 | Choi et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,974,780 B2 | 12/2005 | Schuegraf |
| 7,017,269 B2 | 3/2006 | White et al. |
| 7,030,034 B2 | 4/2006 | Fucsko et al. |
| 7,049,200 B2 | 5/2006 | Arghavani et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |
| 7,390,710 B2 | 6/2008 | Derderian et al. |
| 7,396,480 B2 | 7/2008 | Kao et al. |
| 7,465,358 B2 | 12/2008 | Weidman et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,581,511 B2 | 9/2009 | Mardian et al. |
| 7,628,897 B2 | 12/2009 | Mungekar et al. |
| 7,709,396 B2 | 5/2010 | Bencher et al. |
| 7,722,925 B2 | 5/2010 | White et al. |
| 7,785,672 B2 | 8/2010 | Choi et al. |
| 7,807,578 B2 | 10/2010 | Bencher et al. |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,939,422 B2 | 5/2011 | Ingle et al. |
| 7,968,441 B2 | 6/2011 | Xu |
| 7,981,806 B2 | 7/2011 | Jung |
| 8,008,166 B2 | 8/2011 | Sanchez et al. |
| 8,058,179 B1 | 11/2011 | Draeger et al. |
| 8,071,482 B2 | 12/2011 | Kawada |
| 8,074,599 B2 | 12/2011 | Choi et al. |
| 8,083,853 B2 | 12/2011 | Choi et al. |
| 8,187,486 B1 | 5/2012 | Liu et al. |
| 8,211,808 B2 | 7/2012 | Sapre et al. |
| 8,309,440 B2 | 11/2012 | Sanchez et al. |
| 8,328,939 B2 | 12/2012 | Choi et al. |
| 8,435,902 B2 | 5/2013 | Tang et al. |
| 8,491,805 B2 | 7/2013 | Kushibiki et al. |
| 8,642,481 B2 | 2/2014 | Wang et al. |
| 2001/0008803 A1 | 7/2001 | Takamatsu et al. |
| 2001/0015261 A1 | 8/2001 | Kobayashi et al. |
| 2001/0028922 A1 | 10/2001 | Sandhu |
| 2001/0030366 A1 | 10/2001 | Nakano et al. |
| 2001/0034121 A1 | 10/2001 | Fu et al. |
| 2001/0041444 A1 | 11/2001 | Shields et al. |
| 2001/0055842 A1 | 12/2001 | Uh et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0098681 A1 | 7/2002 | Hu et al. |
| 2002/0124867 A1 | 9/2002 | Kim et al. |
| 2002/0177322 A1 | 11/2002 | Li et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0010645 A1 | 1/2003 | Ting et al. |
| 2003/0019428 A1 | 1/2003 | Ku et al. |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1* | 3/2003 | Tseng et al. ............ 438/257 |

(56) References Cited

U.S. PATENT DOCUMENTS

| | | |
|---|---|---|
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0124465 A1 | 7/2003 | Lee et al. |
| 2003/0124842 A1 | 7/2003 | Hytros et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0148035 A1 | 8/2003 | Lingampalli |
| 2003/0173333 A1 | 9/2003 | Wang et al. |
| 2003/0173347 A1 | 9/2003 | Guiver |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0033678 A1 | 2/2004 | Arghavani et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0101667 A1 | 5/2004 | O'Loughlin et al. |
| 2004/0110354 A1 | 6/2004 | Natzle et al. |
| 2004/0115876 A1 | 6/2004 | Goundar et al. |
| 2004/0129224 A1 | 7/2004 | Yamazaki |
| 2004/0137161 A1 | 7/2004 | Segawa et al. |
| 2004/0154535 A1 | 8/2004 | Chen et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0211357 A1 | 10/2004 | Gadgil et al. |
| 2004/0219789 A1 | 11/2004 | Wood et al. |
| 2004/0245091 A1 | 12/2004 | Karim et al. |
| 2005/0001276 A1 | 1/2005 | Gao et al. |
| 2005/0003676 A1 | 1/2005 | Ho et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0048801 A1 | 3/2005 | Karim et al. |
| 2005/0090120 A1 | 4/2005 | Hasegawa et al. |
| 2005/0098111 A1 | 5/2005 | Shimizu et al. |
| 2005/0112901 A1 | 5/2005 | Ji et al. |
| 2005/0121750 A1 | 6/2005 | Chan et al. |
| 2005/0181588 A1 | 8/2005 | Kim |
| 2005/0199489 A1 | 9/2005 | Stevens et al. |
| 2005/0205110 A1 | 9/2005 | Kao et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0266622 A1 | 12/2005 | Arghavani et al. |
| 2005/0266691 A1 | 12/2005 | Gu et al. |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0019456 A1 | 1/2006 | Bu et al. |
| 2006/0019486 A1 | 1/2006 | Yu et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0046419 A1 | 3/2006 | Sandhu et al. |
| 2006/0046484 A1 | 3/2006 | Abatchev et al. |
| 2006/0051966 A1 | 3/2006 | Or et al. |
| 2006/0051968 A1 | 3/2006 | Joshi et al. |
| 2006/0093756 A1 | 5/2006 | Rajagopalan et al. |
| 2006/0102076 A1 | 5/2006 | Smith et al. |
| 2006/0130971 A1 | 6/2006 | Chang et al. |
| 2006/0166107 A1 | 7/2006 | Chen et al. |
| 2006/0166515 A1 | 7/2006 | Karim et al. |
| 2006/0185592 A1 | 8/2006 | Matsuura |
| 2006/0207504 A1 | 9/2006 | Hasebe et al. |
| 2006/0211260 A1 | 9/2006 | Tran et al. |
| 2006/0216923 A1 | 9/2006 | Tran et al. |
| 2006/0226121 A1 | 10/2006 | Aoi |
| 2006/0240661 A1 | 10/2006 | Annapragada et al. |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0261490 A1 | 11/2006 | Su et al. |
| 2006/0264003 A1 | 11/2006 | Eun |
| 2006/0264043 A1 | 11/2006 | Stewart et al. |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0123051 A1 | 5/2007 | Arghavani et al. |
| 2007/0181057 A1 | 8/2007 | Lam et al. |
| 2007/0197028 A1 | 8/2007 | Byun et al. |
| 2007/0232071 A1 | 10/2007 | Balseanu et al. |
| 2007/0238321 A1 | 10/2007 | Futase et al. |
| 2007/0269976 A1 | 11/2007 | Futase et al. |
| 2007/0281106 A1 | 12/2007 | Lubomirsky et al. |
| 2008/0044990 A1 | 2/2008 | Lee |
| 2008/0081483 A1 | 4/2008 | Wu |
| 2008/0085604 A1 | 4/2008 | Hoshino et al. |
| 2008/0099431 A1 | 5/2008 | Kumar et al. |
| 2008/0115726 A1 | 5/2008 | Ingle et al. |
| 2008/0124919 A1 | 5/2008 | Huang et al. |
| 2008/0124937 A1 | 5/2008 | Xu et al. |
| 2008/0142483 A1 | 6/2008 | Hua et al. |
| 2008/0142831 A1 | 6/2008 | Su |
| 2008/0160210 A1 | 7/2008 | Yang et al. |
| 2008/0162781 A1 | 7/2008 | Haller et al. |
| 2008/0182381 A1 | 7/2008 | Kiyotoshi |
| 2008/0182382 A1 | 7/2008 | Ingle et al. |
| 2008/0230519 A1 | 9/2008 | Takahashi |
| 2008/0233709 A1 | 9/2008 | Conti et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2009/0004849 A1 | 1/2009 | Eun |
| 2009/0017227 A1 | 1/2009 | Fu et al. |
| 2009/0045167 A1 | 2/2009 | Maruyama |
| 2009/0104738 A1 | 4/2009 | Ring et al. |
| 2009/0104764 A1 | 4/2009 | Xia et al. |
| 2009/0104782 A1 | 4/2009 | Lu et al. |
| 2009/0189246 A1 | 7/2009 | Wu et al. |
| 2009/0255902 A1 | 10/2009 | Satoh et al. |
| 2009/0275205 A1 | 11/2009 | Kiehlbauch et al. |
| 2009/0275206 A1 | 11/2009 | Katz et al. |
| 2009/0280650 A1 | 11/2009 | Lubomirsky et al. |
| 2010/0059889 A1 | 3/2010 | Gosset et al. |
| 2010/0075503 A1 | 3/2010 | Bencher et al. |
| 2010/0093151 A1 | 4/2010 | Arghavani et al. |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0105209 A1 | 4/2010 | Winniczek et al. |
| 2010/0144140 A1 | 6/2010 | Chandrashekar et al. |
| 2010/0173499 A1 | 7/2010 | Tao et al. |
| 2010/0187534 A1 | 7/2010 | Nishi et al. |
| 2010/0187588 A1 | 7/2010 | Kim et al. |
| 2010/0330814 A1 | 12/2010 | Yokota et al. |
| 2011/0008950 A1 | 1/2011 | Xu |
| 2011/0034035 A1 | 2/2011 | Liang et al. |

(56) References Cited

U.S. PATENT DOCUMENTS

| | | |
|---|---|---|
| 2011/0053380 A1 | 3/2011 | Sapre et al. |
| 2011/0081782 A1 | 4/2011 | Liang et al. |
| 2011/0143542 A1 | 6/2011 | Feurprier et al. |
| 2011/0151674 A1 | 6/2011 | Tang et al. |
| 2011/0151676 A1 | 6/2011 | Ingle et al. |
| 2011/0151677 A1 | 6/2011 | Wang et al. |
| 2011/0151678 A1 | 6/2011 | Ashtiani et al. |
| 2011/0159690 A1 | 6/2011 | Chandrashekar et al. |
| 2011/0165771 A1 | 7/2011 | Ring et al. |
| 2011/0195575 A1 | 8/2011 | Wang |
| 2011/0226734 A1 | 9/2011 | Sumiya et al. |
| 2011/0230052 A1 | 9/2011 | Tang et al. |
| 2011/0266252 A1 | 11/2011 | Thadani et al. |
| 2011/0294300 A1 | 12/2011 | Zhang et al. |
| 2012/0003782 A1 | 1/2012 | Byun et al. |
| 2012/0009796 A1 | 1/2012 | Cui et al. |
| 2012/0068242 A1 | 3/2012 | Shin et al. |
| 2012/0135576 A1 | 5/2012 | Lee et al. |
| 2012/0196447 A1 | 8/2012 | Yang et al. |
| 2012/0211462 A1 | 8/2012 | Zhang et al. |
| 2012/0238102 A1 | 9/2012 | Zhang et al. |
| 2012/0238103 A1 | 9/2012 | Zhang et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0089988 A1 | 4/2013 | Wang et al. |
| 2013/0119483 A1 | 5/2013 | Alptekin et al. |
| 2013/0260533 A1 | 10/2013 | Sapre et al. |
| 2013/0284369 A1 | 10/2013 | Kobayashi et al. |
| 2013/0284370 A1 | 10/2013 | Kobayashi et al. |

FOREIGN PATENT DOCUMENTS

| | | |
|---|---|---|
| CN | 101465386 A | 6/2009 |
| EP | 0329406 | 8/1989 |
| EP | 0376252 A2 | 7/1990 |
| EP | 0475567 | 3/1992 |
| EP | 0 496 543 A2 | 7/1992 |
| EP | 0 658 928 A1 | 6/1995 |
| EP | 0697467 A1 | 2/1996 |
| EP | 0913498 | 5/1999 |
| EP | 1099776 | 5/2001 |
| EP | 1107288 | 6/2001 |
| EP | 1496542 | 1/2005 |
| EP | 1568797 | 8/2005 |
| GB | 2285174 | 6/1995 |
| JP | 61-276977 A | 12/1986 |
| JP | 2058836 A | 2/1990 |
| JP | 02-121330 A | 5/1990 |
| JP | 02256235 | 10/1990 |
| JP | 4-239750 | 7/1992 |
| JP | 4-341568 A | 11/1992 |
| JP | 07-130713 A | 5/1995 |
| JP | 7-161703 A | 6/1995 |
| JP | 7297543 | 11/1995 |
| JP | 08-306671 A | 11/1996 |
| JP | 09153481 A | 6/1997 |
| JP | 09-205140 A | 8/1997 |
| JP | 10-178004 A | 6/1998 |
| JP | 2010-154699 | 6/1998 |
| JP | 11124682 | 5/1999 |
| JP | H11-204442 | 7/1999 |
| JP | 2000-012514 A | 1/2000 |
| JP | 2001-308023 | 11/2001 |
| JP | 2002-100578 | 4/2002 |
| JP | 2002-141349 | 5/2002 |
| JP | 2002-222861 A | 8/2002 |
| JP | 2003-019433 | 1/2003 |
| JP | 2003-059914 | 2/2003 |
| JP | 2003-179038 A | 6/2003 |
| JP | 2003-217898 | 7/2003 |
| JP | 2003-318158 A | 11/2003 |
| JP | 2003-347278 A | 12/2003 |
| JP | 2004-047956 A | 2/2004 |
| JP | 2004-156143 A | 6/2004 |
| JP | 04-239723 A | 8/2004 |
| JP | 2005-033023 A | 2/2005 |
| JP | 2007-173383 A | 7/2007 |
| JP | 08-148470 A | 6/2008 |
| KR | 10-0155601 B1 | 12/1998 |
| KR | 10-0236219 B1 | 12/1999 |
| KR | 1020000008278 A | 2/2000 |
| KR | 2000-0044928 | 7/2000 |
| KR | 2001-0014064 A | 2/2001 |
| KR | 10-2001-0049274 A | 6/2001 |
| KR | 10-2001-0058774 A | 7/2001 |
| KR | 10-2001-0082109 | 8/2001 |
| KR | 1020030096140 | 12/2003 |
| KR | 10-2004-0049739 A | 6/2004 |
| KR | 10-2004-0096365 A | 11/2004 |
| KR | 1020050042701 A | 5/2005 |
| KR | 10-0681390 | 9/2006 |
| KR | 1020080063988 A | 7/2008 |
| KR | 10-2010-0013980 A | 2/2010 |
| KR | 10-2010-0074508 A | 7/2010 |
| KR | 10-1050454 B1 | 7/2011 |
| KR | 1020110126675 A | 11/2011 |
| KR | 1020120082640 A | 7/2012 |
| WO | 92/20833 A1 | 11/1992 |
| WO | 99/26277 A1 | 5/1999 |
| WO | 99/54920 A2 | 10/1999 |
| WO | 99/62108 A2 | 12/1999 |
| WO | 00/13225 A1 | 3/2000 |
| WO | 00/22671 | 4/2000 |
| WO | 01/94719 A1 | 12/2001 |
| WO | 02083981 A2 | 10/2002 |
| WO | 03014416 | 2/2003 |
| WO | 2004/006303 | 1/2004 |
| WO | 2004/074932 | 9/2004 |
| WO | 2004/114366 A2 | 12/2004 |
| WO | 2005036615 A2 | 4/2005 |
| WO | 2006/069085 A2 | 6/2006 |
| WO | 2009/071627 A2 | 6/2009 |
| WO | 2011/087580 A1 | 7/2011 |
| WO | 2011/115761 A2 | 9/2011 |
| WO | 2011/139435 A2 | 11/2011 |
| WO | 2012/018449 A2 | 2/2012 |
| WO | 2012/125654 A2 | 9/2012 |

OTHER PUBLICATIONS

Cho et al., "Dielectric-barrier microdischarge structure for efficient positive-column plasma using a thick-film ceramic sheet," IEEE Trans. Plasma Sci., vol. 37, No. 8, Aug. 2009, 4 pgs.

Cho, T.S., "Dual Discharge Modes Operation of an Argon Plasma Generated by Commercial Electronic Ballast for Remote Plasma Removal Process," IEEE Transactions on Plasma Science, vol. 42, No. 6, Jun. 2014, 4 pages.

Cho et al., "Three-dimensional spatiotemporal behaviors of light emission from discharge plasma of alternating current plasma display panels," Appl. Phys. Lett., vol. 92, No. 22, Jun. 2008, 3pgs.

Cho et al., "Analysis of address discharge modes by using a three-dimensional plasma display panel," IEEE Trans. Plasma Sci., vol. 36, Oct. 2008, 4 pgs.

C.K. Hu, et al. "Reduced Electromigration of Cu Wires by Surface Coating" Applied Physics Letters, vol. 81, No. 10, Sep. 2, 2002—pp. 1782-1784.

European Search Report dated May 23, 2006 for EP Application No. 05251143.3.

European Examination Report dated Nov. 13, 2007 for EP Application No. 05251143.3.

EP Partial Search Report, Application No. 08150111.601235/1944796, dated Aug. 22, 2008.

Eze, F. C., "Electroless deposition of CoO thin films," J. Phys. D: Appl. Phys. 32 (1999), pp. 533-540.

(56) References Cited

OTHER PUBLICATIONS

Galiano et al. "Stress-Temperature Behavior of Oxide Films Used for Intermetal Dielectric Applications", VMIC Conference, Jun. 9-10, 1992, pp. 100-106.
Goebels, F.J. et al. "Arbitrary Polarization from Annular Slot Planar Antennas." Ire Transactions on Antennas and Propagation, Jul. 1961, 8 pgs.
Iijima, et al., "Highly Selective $SiO_2$ Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.
International Search Report of PCT/US2009/059743 mailed on Apr. 26, 2010, 4 pages.
International Search Report of PCT/US2012/061726 mailed on May 16, 2013, 3 pages.
International Search Report of PCT/2013/052039 mailed on Nov. 8, 2013, 9 pages.
International Search Report of PCT/2013/037202 mailed on Aug. 23, 2013, 11 pages.
Kim et al., "Pendulum electrons in micro hollow cathode di scharges," IEEE Trans. Plasma Sci. , vol. 36, No. 4, pp. Aug. 2008, 2 pgs.
Lin, et al., "Manufacturing of Cu Electroless Nickel/Sn-Pb Flip Chip Solder Bumps", IEEE Transactions on Advanced Packaging, vol. 22, No. 4 (Nov. 1999), pp. 575-579.
Lopatin, et al., "Thin Electroless barrier for copper films", Part of the SPIE Conference of Multilevel Interconnect technology II, SPIE vol. 3508 (1998), pp. 65-77.
Musaka, "Single Step Gap Filling Technology fo Subhalf Micron Metal Spacings on Plasma Enhanced $TEOS/O_2$ Chemical Vapor Deposition System," Extended Abstracts of the 1993 International Conference on Solid State Devices and Materials pages, 1993, 510-512.
Pearlstein, Fred. "Electroless Plating," J. Res. Natl. Bur. Stan., Ch. 31 (1974), pp. 710-747.
Redolfi et al., "Bulk FinFET fabrication with new approaches for oxide topography control using dry removal techniques," Solid-State Electron., vol. 71, May 2012, 7 pgs.
Saito, et al., "Electroless deposition of Ni—B, Co—B and Ni—Co—B alloys using dimethylamineborane as a reducing agent," Journal of Applied Electrochemistry 28 (1998), pp. 559-563.
Schacham-Diamond, et al., "Electrochemically deposited thin film alloys for ULSI and MEMS applications," Microelectronic Engineering 50 (2000), pp. 525-531.
Schoenbach et al.,"High-pressure hollow cathode di scharges," Plasma Sources Sci. Te chnol., vol. 6, No. 4, Nov. 1997, 10 pgs.
Smayling, et al., "APF® Pitch-Halving for 2nm Logic Cells using Gridded Design Rules", proceedings of the SPIE, 2008, 8 pages.
Vassiliev, et al., "Trends in void-free pre-metal CVD dielectrics," Solid State Technology, Mar. 2001, pp. 129-136.
Weston, et al., "Ammonium Compounds," Kirk-Othmer Encyclopedia of Chemical Technology, 2003, 30 pages see pp. 717-718, John Wiley & Sons, Inc.
Yasaka, Y. et al. "Planar microwave discharges with active control of plasma uniformity". Physics of Plasmas, vol. 9 No. 3, Mar. 2002, 7 pgs.
Yosi Shacham-Diamond, et al. "High Aspect Ratio Quarter-Micron Electroless Copper Integrated Technology", Microelectronic Engineering 37/38 (1997) pp. 77-88.
Abraham, "Reactive Facet Tapering of Plasma Oxide for Multilevel Interconnect Applications", IEEE, V-MIC Conference, Jun. 15-16, 1987, pp. 115-121.
Applied Materials, Inc., "Applied Siconi™ Preclean," printed on Aug. 7, 2009, 8 pages.
Carlson, et al., "A Negative Spacer Lithography Process for Sub-100nm Contact Holes and Vias", University of California at Berkeley, Jun. 19, 2007, 4 pp.
Chang et al. "Frequency Effects and Properties of Plasma Deposited Fluorinated Silicon Nitride", J. Vac Sci Technol B 6(2), Mar./Apr. 1988, pp. 524-532.

Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.
Examination Report dated Jun. 28, 2010 for European Patent Application No. 05251143.3. I.
Fukada et al., "Preparation of SiOF Films with Low Dielectric Constant by ECR Plasma CVD," ISMIC, DUMIC Conference, Feb. 21-22, 1995, pp. 43-49.
Hashim et al., "Characterization of thin oxide removal by RTA Treatment," ICSE 1998 Proc. Nov. 1998, Rangi, Malaysia, pp. 213-216.
Hausmann, et al., "Rapid Vapor Deposition of Highly Conformal Silica Nanolaminates," Science, Oct. 11, 2002, p. 402-406, vol. 298.
Hayasaka, N. et al. "High Quality Low Dielectric Constant SiO2 CVD Using High Density Plasma," Proceedings of the Dry Process Symposium, 1993, pp. 163-168.
Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.
International Search Report and Written Opinion of the International Searching Authority mailed Jul. 3, 2008 (PCT/US05/46226).
International Search Report and Written Opinion for PCT Application No. PCT/US2011/027221, mailed on Nov. 1, 2011, 8 pages.
International Search Report and Written Opinion of PCT/US2010/057676 mailed on Jun. 27, 2011, 9 pages.
International Search Report and Written Opinion of PCT/US2011/030582 mailed Dec. 7, 2011, 9 pages.
International Search Report and Written Opinion of PCT/US2011/064724 mailed on Oct. 12, 2012, 8 pages.
International Search Report and Written Opinion of PCT/US2012/028952 mailed on Oct. 29, 2012, 9 pages.
International Search Report and Written Opinion of PCT/US2012/048842 mailed on Nov. 28, 2012, 10 pages.
International Search Report and Written Opinion of PCT/US2012/053329 mailed on Feb. 15, 2013, 8 pages.
International Search Report and Written Opinion of PCT/US2012/057294 mailed on Mar. 18, 2013, 12 pages.
International Search Report and Written Opinion of PCT/US2012/057358 mailed on Mar. 25, 2013, 10 pages.
International Search Report and Written Opinion of PCT/US2012/058818 mailed on Apr. 1, 2013, 9 pages.
International Search Report and Written Opinion of the International Searching Authority for PCT Application No. PCT/US2012/028957, mailed on Oct. 18, 2012, 9 pages.
International Search report and Written Opinion of PCT/CN2010/000932 dated Mar. 31, 2011, 8 pages.
Japanese Patent Office, Official Action for Application No. 2007-317207 mailed on Dec. 21, 2011, 2 pages.
International Search Report and Written Opinion of PCT/US2013/076217 mailed on Apr. 28, 2014, 11 pages.
Jung, et al., "Patterning with amorphous carbon spacer for expanding the resolution limit of current lithography tool", Proc. SPIE, 2007, 9 pages, vol. 6520, 65201C.
Laxman, "Low ∈ Dielectrics: CVD Fluorinated Silicon Dioxides", Semiconductor International, May 1995, pp. 71-74.
Lee, et al., "Dielectric Planarization Techniques For Narrow Pitch Multilevel Interconnects," IEEE, V-MIC Conference Jun. 15-16, 1987, pp. 85-92 (1987).
Matsuda, et al. "Dual Frequency Plasma CVD Fluorosilicate Glass Deposition for 0.25 um Interlevel Dielectrics", ISMIC, DUMIC Conference Feb. 21-22, 1995, pp. 22-28.
Meeks, Ellen et al., "Modeling of $SiO_2$ deposition in high density plasma reactors and comparisons of model predictions with experimental measurements," J. Vac. Sci. Technol. A, Mar./Apr. 1998, pp. 544-563, vol. 16(2).
Mukai, et al., "A Study of CD Budget in Spacer Patterning Process", Toshiba, SPIE 2008, Feb. 26, 2008, 12 pages.
Nishino, et al.; Damage-Free Selective Etching of SI Native Oxides Using NH3/NF3 and SF6/H20 Down-Flow Etching, The Japanese Society of Applied Physics, vol. 74, No. 2, pp. 1345-1348, XP-002491959, Jul. 15, 1993.

(56) References Cited

OTHER PUBLICATIONS

Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.

Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.

Qian, et al., "High Density Plasma Deposition and Deep Submicron Gap Fill with Low Dielectric Constant SiOF Films," ISMIC, DUMIC Conference Feb. 21-22, 1995, 1995, pp. 50-56.

Robles, et al. "Effects of RF Frequency and Deposition Rates on the Moisture Resistance of PECVD TEOS-Based Oxide Films", ECS Extended Abstracts, Abstract No. 129, May 1992, pp. 215-216, vol. 92-1.

Shapiro, et al. "Dual Frequency Plasma CVD Fluorosilicate Glass: Water Absorption And Stability", ISMIC, DUMIC Conference Feb. 21-22, 1995, 1995. pp. 118-123.

C.C. Tang and D. W. Hess, Tungsten Etching in CF4 and SF6 Discharges, J. Electrochem. Soc., 1984, 131 (1984) p. 115-120.

Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.

Wang et al.; Ultra High-selectivity silicon nitride etch process using an inductively coupled plasma source; J. Vac. Sci. Techno!. A 16(3), May/Jun. 1998, pp. 1582-1587.

Wolf et al.; Silicon Processing for the VLSI Era; vol. 1; 1986; Lattice Press, pp. 546, 547, 618, 619.

Yang, R., "Advanced in situ pre-Ni sillicide (Siconi) cleaning at 65 nm to resolve defects in NiSix modules,"J. Vac. Sci., Technol. B, Microelectron. Nanometer Struct., vol. 28, No. 1, Jan. 2010, 6 pgs.

Yasuda et al., "Dual-function remote plasma etching/cleaning system applied to selective etching of SiO2 and removal of polymeric residues," J. Vac. Sci. Technol., A, vol. 11, No. 5, 1993, 12 pgs.

Yu, et al., "Step Coverage Study of Peteos Deposition for Intermetal Dielectric Applications," abstract, VMIC conference, Jun. 12-13, 1990, 7 pages, No. 82.

Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.

* cited by examiner

INTRENCH PROFILE

CROSS-REFERENCES TO RELATED APPLICATIONS

This application is a Divisional of U.S. patent application Ser. No. 13/624,724, filed Sep. 21, 2012, which claims the benefit of U.S. Provisional Application No. 61/539,279, filed Sep. 26, 2011, entitled "Improved Intrench Profile," the entire disclosures of both of which are hereby incorporated by reference for all purposes.

BACKGROUND

Semiconductor processing often include many distinct manufacturing steps. With the current state of technology, circuit components are routinely formed on nanometer scales, and sensitive manufacturing techniques are required. For instance, with integration schemes for shallow-trench-isolation ("STI") gate formation, a sacrificial film must be removed preferentially in the presence of a selective material in a nanometer thin trench. As semiconductor technology continues to evolve, these semiconductor substrate trenches continue to shrink in width, which makes film removal even more difficult.

These small width trenches create a need for delicate etching techniques. Although a variety of etch techniques are available, few provide the selective removal necessary for such intricate detail. For example, wet removal using hydrogen-fluoride solutions can be used for a selective removal. However, such a wet removal cannot be used for STI recessing because the process chemistry and bath life often cannot be sufficiently controlled for such detailed etching.

Dry etching techniques are available and have been shown to provide selective removal. For example, Siconi™ processes that use a combination of dry etchant gases including ammonia and a fluorine-containing gas have been used for better control of the material removal during the removal. However, the dry etchant gas still selectivity etches oxides of different quality at different rates. Although this oxide selectivity is often acceptable during semiconductor processing, in STI recessing, the minute selectivity can cause concave profiles in the STI trenches where a liner oxide is present with a flowable oxide. This slight concavity, or meniscus, can potentially cause integration issues with integrated passive device scaling and control gate polysilicon fill between the trenches. Thus, there is a need for improved intrench profiles in STI recess production. These and other needs are addressed by the present invention.

BRIEF SUMMARY

The present technology provides methods of removing dielectric materials of different qualities from within a trench that has been etched on a semiconductor substrate. The removal may be performed with dry etchant gases that are insensitive to the quality of a deposited oxide. By being insensitive, the dry etchant gases may remove different oxides at substantially similar rates. In this way, trenches that include multiple oxides of different qualities may be etched so that the profile within the trench is uniform across the different oxides.

Methods of etching recesses in semiconductor substrates are described. The methods may include forming a dielectric liner layer in a trench of the substrate where the liner layer has a first density. The method may also include depositing a second dielectric layer at least partially in the trench on the liner layer. The second dielectric layer may initially be flowable following the deposition, and the second dielectric layer may have a second density that is less than the first density of the liner layer. The method may further include exposing the substrate to a dry etchant, where the etchant removes a portion of the first liner layer and the second dielectric layer to form a recess, where the dry etchant includes a fluorine-containing compound and molecular hydrogen. The etch rate ratio for removing the first dielectric liner layer to removing the second dielectric layer is about 1:1.2 to about 1:1.

Embodiments of the invention also include methods of etching a dielectric material located between sections of a selective material over a semiconductor substrate. Selective materials may include materials such as polysilicon or other materials used to form structures such as floating gates. Selective materials such as polysilicon may require removal techniques that can maintain as much of the selective material as possible while removing other materials. In another sense, selective materials may be preferentially removed during certain types of wet or corrosive etching as opposed to sacrificial materials, and thus removal techniques that maintain the selective materials may be used. The methods include depositing a selective material over a semiconductor substrate. The methods may also include etching at least one trench in the selective material and semiconductor substrate that creates at least two sections of the selective material that are isolated from one another on the semiconductor substrate. The dielectric material may be deposited to at least partially fill the trench between the isolated sections of the selective material. The substrate may then be exposed to a dry etchant gas that removes a portion of the dielectric layer between the isolated sections of the selective material to form a recess. The dry etchant gas may include a fluorine-containing compound and molecular hydrogen.

Additional embodiments and features are set forth in part in the description that follows, and will become apparent to those skilled in the art upon examination of the specification and/or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

In the following description, for the purposes of explanation, numerous details are set forth in order to provide an understanding of various embodiments of the present invention. It will be apparent to one skilled in the art, however, that certain embodiments can be practiced without some of these details, or with additional details.

The present technology provides methods of etching recesses in semiconductor substrates in which a dry etchant that is substantially free of ammonia is used. By including a minimal concentration of ammonia, the amount of fluorine radicals within the etchant gas may be enhanced, which may allow for removal that is less sensitive to oxide quality. The dry etchant may include a fluorine-containing gas and molecular hydrogen.

Methods of etching a recess in a semiconductor substrate are described. The methods may include forming a dielectric liner layer in a trench of the substrate where the liner layer has a first density. The methods may also include depositing a second dielectric layer at least partially in the trench on the liner layer. The second dielectric layer may be initially flowable following the deposition, and the second dielectric layer may have a second density that is less than the first density of the liner layer. The methods may further include exposing the substrate to a dry etchant, where the etchant removes a portion of the first liner layer and the second dielectric layer to form a recess, where the dry etchant includes a fluorine-containing compound and molecular hydrogen, and where the etch rate ratio for removing the first dielectric liner layer to removing the second dielectric layer is about 1:1.2 to about 1:1.

Figure 1:
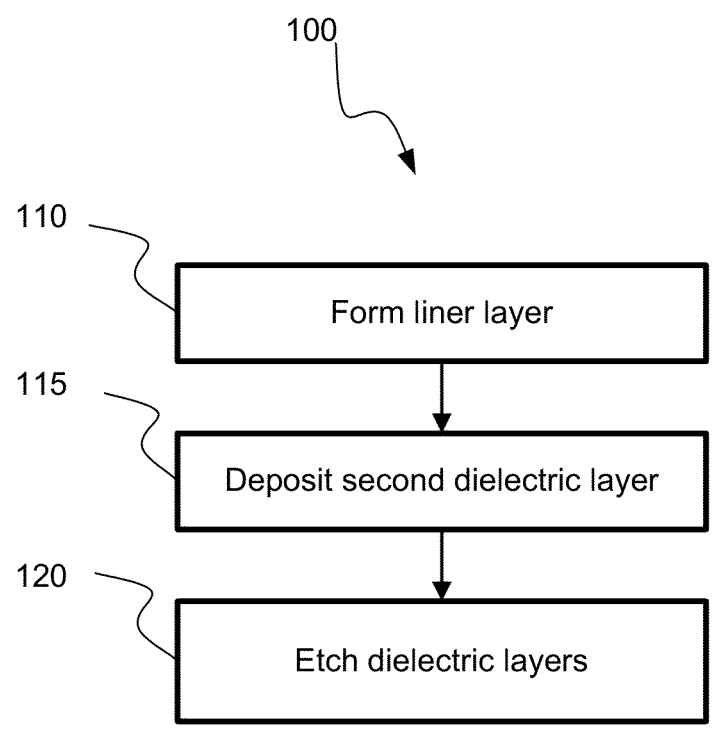
FIG. 1 shows a flowchart of an etch process according to disclosed embodiments.

Referring to FIG. 1, which shows an etch process 100 according to disclosed embodiments, a dielectric liner layer 110 may be formed on a semiconductor substrate. The dielectric liner layer initially deposited in the trench may be deposited so as to produce a substantially conformal liner. Conformality refers to a deposited film layer having a uniform thickness on both horizontal and vertical surfaces, or a step coverage equal to about one. The liner may also be formed over other layers of the substrate including pad oxides and floating gates. This liner helps to avoid shorting in the silicon through the lower quality flowable dielectrics that may be used for filling the gap due to their better gap-filling qualities such as flowability. In some embodiments, the dielectric liner layer is deposited by a less-flowable or non-flowable deposition technique, which may be HDP-CVD, or in other embodiments may be SACVD such as HARP, or PECVD such as plasma-enhanced TEOS and oxygen or TEOS and ozone. The deposited dielectric may include a silicon oxide such as an undoped silica glass or a doped silica such as phosphorous silicate glass, borosilicate glass, or borophosphosilicate glass. Still other dielectrics may include silicon nitride and silicon oxy-nitride.

An HDP deposition produces a liner layer with an HDP quality oxide, such as silicon oxide, which as the first dielectric layer has a first density as well as an overall quality that is higher than an oxide that is deposited by a flowable process. The HDP film is produced by exciting the reactant gases at low pressure or even vacuum, often with radio frequency energy, which creates a plasma near the substrate surface. The plasma energy causes the elements to be highly reactive and produces high density and high quality films. In other embodiments a thermal process may be performed on the substrate to produce the liner oxide layer in which chemical reactions of the reactant gases are caused by heating the substrate up to a high temperature to induce the reaction and formation of the film.

A second dielectric layer may be deposited 115 that is produced by a flowable deposition method, which can include spin-on-glass or flowable CVD for example. In some embodiments, flowable CVD is used to cover the dielectric liner layer and fill the trench in the substrate. The flowable oxide may be formed by exciting precursor gases separately, and then allowing them to combine in a region of the process chamber directly over the substrate to produce the flowable oxide that starts at the top of the trench, and then flows down to fill it in without creating voids or seams. The second dielectric layer has a second density that is less than the first density of the liner layer. In addition to filling the trench, in some embodiments the flowable oxide can additionally fill between pad oxide layers such as silicon nitride, or additionally can fill between polysilicon floating gates for situations including producing Nand flash, for example.

A variety of methods can be used to deposit dielectric layers that are initially flowable after deposition. For example, a flowable CVD process may be used in which a silicon precursor is introduced to the substrate processing region housing the substrate. Another precursor is introduced only after passing through a remote plasma region to create a radical precursor, such as a nitrogen precursor, which is then flowed into the substrate processing region and combined with the silicon precursor. In this technique, the silicon-containing precursor is not directly excited by an application of plasma power in the substrate processing region. Instead, plasma power just excites the precursor outside the substrate processing region. This arrangement results in the flowable deposition of a silicon-and-nitrogen-containing layer into the lined trench. The flowability of the film attenuates as the deposition proceeds and the flowability is essentially removed during a curing operation described below.

The silicon-containing precursor may contain carbon and/or nitrogen in order to ensure flowability during gapfill dielectric layer formation. In some embodiments, the silicon-containing precursor may be a carbon-free silicon-containing precursor which enables the gapfill layer to undergo less shrinkage during the curing process. The carbon-free silicon precursor may be, for example, a silicon-and-nitrogen precursor, a silicon-and-hydrogen precursor, or a silicon-nitrogen-and-hydrogen containing precursor, among other classes of silicon precursors. Specific examples of these precursors may include silyl-amines such as $H_2N(SiH_3)$, $HN(SiH_3)_2$, and $N(SiH_3)_3$, among other silyl-amines. These silyl-amines may be mixed with additional gases that may act as carrier gases, reactive gases, or both. Examples of the these additional gases may include $H_2$, $N_2$, $NH_3$, He, and Ar, among other gases. Examples of carbon-free silicon precursors may also include silane ($SiH_4$) either alone or mixed with other silicon (e.g., $N(SiH_3)_3$), hydrogen (e.g., $H_2$), and/or nitrogen (e.g., $N_2$, $NH_3$) containing gases. The silicon-containing precursors may also include silicon compounds that have no carbon or nitrogen, such as silane, disilane, etc. If the deposited oxide film is a doped oxide film, dopant precursors may also be used such as TEB, TMB, $B_2H_6$, TEPO, $PH_3$, $P_2H_6$, and TMP, among other boron and phosphorous dopants.

Nitrogen may be included in either or both of the radical precursor and the silicon-containing precursor. When nitrogen is present in the radical precursor, it may be referred to as a radical-nitrogen precursor. The radical-nitrogen precursor includes plasma effluents created by exciting a more stable nitrogen-containing precursor in a plasma. For example, a relatively stable nitrogen-containing precursor containing $NH_3$ and/or hydrazine ($N_2H_4$) may be activated in a chamber plasma region or a remote plasma system (RPS) outside the processing chamber to form the radical-nitrogen precursor, which is then transported into a plasma-free substrate processing region. The stable nitrogen precursor may also be a mixture comprising $NH_3$ & $N_2$, $NH_3$ & $H_2$, $NH_3$ & $N_2$ & $H_2$ and $N_2$ & $H_2$, in different embodiments. Hydrazine may also be used in place of or in combination with $NH_3$ in the mixtures with $N_2$ and $H_2$. The flow rate of the stable nitrogen precursor may be greater than or about 200 sccm, greater than or about 300 sccm, greater than or about 500 sccm or greater than or about 700 sccm in different embodiments. Nitrogen-containing precursors may also include $N_2O$, $NO$, $NO_2$ and $NH_4OH$.

The radical-nitrogen precursor produced may include one or more of •N, •NH, •$NH_2$, etc., and may also be accompanied by ionized species formed in the plasma. In other embodiments, the radical-nitrogen precursor is generated in a section of the processing chamber partitioned from the substrate processing region where the precursors mix and react to deposit the silicon-and-nitrogen layer on a deposition substrate (e.g., a semiconductor wafer). The partition may be incorporated into a showerhead that supplies the reactants to the substrate processing region. The radical-nitrogen precursor may also be accompanied by a carrier gas such as argon, helium, etc. Oxygen may be simultaneously delivered into the remote plasma region (in the form of $O_2$ and/or $O_3$) to adjust the amount of oxygen content in the radical-nitrogen precursor and liner or gapfill layer deposited with this technique.

The flowability may be due, at least in part, to a significant hydrogen component in the deposited film. For example the deposited film may have a silazane-type, Si—NH—Si backbone (i.e., a Si—N—H film). Flowability may also result from short chained polymers of the silazane type. The nitrogen which allows the formation of short chained polymers and flowability may originate from either the radical precursor or the silicon-containing precursor. When both the silicon precursor and the radical-nitrogen precursor are carbon-free, the deposited silicon-and-nitrogen-containing film is also substantially carbon-free. Of course, "carbon-free" does not necessarily mean the film lacks even trace amounts of carbon. Carbon contaminants may be present in the precursor materials that find their way into the deposited silicon-and-nitrogen-containing film. The amount of these carbon impurities however are much less than would be found in a silicon precursor having a carbon moiety (e.g., TEOS, TMDSO, etc.).

In other embodiments, the first and second dielectric layers are both flowable or may both not be flowable. In some embodiments the dielectrics are deposited by different mechanisms (e.g., the first is not flowable, and the second is flowable), but have similar dielectric qualities depending on the reactants used. In still other embodiments, the first and second dielectrics are deposited by the same mechanism, but have different qualities due to the use of different reactant species for the two dielectrics.

Flowable film growth may proceed while the substrate temperature is maintained at a relatively low temperature during deposition of the silicon-containing films. The flowable oxide film may be deposited on the substrate surface at a low temperature that is maintained by cooling the substrate during the deposition. The pedestal may include heating and/or cooling conduits that set the temperature of the pedestal and substrate between about −40° C. and about 1000° C., between about 100° C. and about 600° C., less than about 500° C. or at about 400° C. or less in different embodiments.

After the flowable dielectric has been deposited on the substrate, an etching process can be performed in order to remove excess dielectric in preparation for subsequent integrated passive device manufacturing steps. In some embodiments, a dry etchant gas is used to etch 120 the dielectric layers. The etchant removes a portion of both the first liner layer and the second dielectric layer. The gases included in the etchant may include gases that pass through a remote plasma region to be excited prior to entering the semiconductor processing region. The etchant may include a fluorine-containing compound and molecular hydrogen, and reacts with the dielectric layers to produce solid byproducts that sublimate when the temperature of the substrate is raised above the sublimation temperature, thereby removing the excess dielectric. The etch rate ratio for removing the first dielectric liner layer to removing the second dielectric layer may be about 1:2, or in other embodiments may be about 1:1.5, 1:1.3, 1:1.2, 1:1.1, or about 1:1. When the etch rate ratio is equal to 1:1 the separate dielectrics are removed at the same rate.

In some embodiments the dry etchant gas contains nitrogen trifluoride along with molecular hydrogen. In other embodiments the dry etchant gas is substantially free of ammonia. The dry etchant gas combination of nitrogen trifluoride and hydrogen may produce a slower reaction that is less selective of oxide quality than a dry etchant gas that includes ammonia. The addition of ammonia may reduce the concentration of fluorine in the reactive species producing ammonium fluoride and ammonium hydrogen fluoride. These products may remove a lower density and lower quality flowable dielectric at a faster rate than the higher density, higher quality liner oxide layer deposited by, for example, HDP. By having a selectivity with respect to HDP oxide that is closer to 1:1, the dry etchant gas that is substantially free of ammonia is able to produce recesses that have a less concave corner profile than a dry etchant gas that includes ammonia. In some embodiments, the dry etchant gas that is substantially free of ammonia produces a corner profile that is substantially flat against the sidewall of the recess.

The flowable dielectric may be cured following deposition in order to improve the dielectric film quality. Curing may be carried out in oxidative environments like steam, inert environments such as nitrogen, or other environments in various embodiments. The flowability of the film attenuates as the deposition proceeds and the flowability is essentially removed during a curing operation. The curing operation may involve converting the silicon-and-nitrogen-containing layer to silicon oxide. Curing involves raising the patterned substrate temperature and exposing the gapfill dielectric layer to an oxygen-containing environment. In some embodiments, the elevated temperature induces the oxide to diffuse from the liner layer into the gapfill layer which provides an additional source of oxygen from underneath the gapfill dielectric layer. The curing may be an anneal, and may be performed at temperatures below about 1000° C. In other embodiments, the curing may occur below about 800° C., 600° C., 500° C., 400° C., 300° C., or below about 200° C. Utilizing a flowable dielectric may reduce the thermal budget of the manufacturing processes, and in some cases the processes may be performed below about 600° C., 500° C., 400° C., 300° C., 200° C., or below about 100° C. in order to maintain the flowable dielectric.

Figure 2:
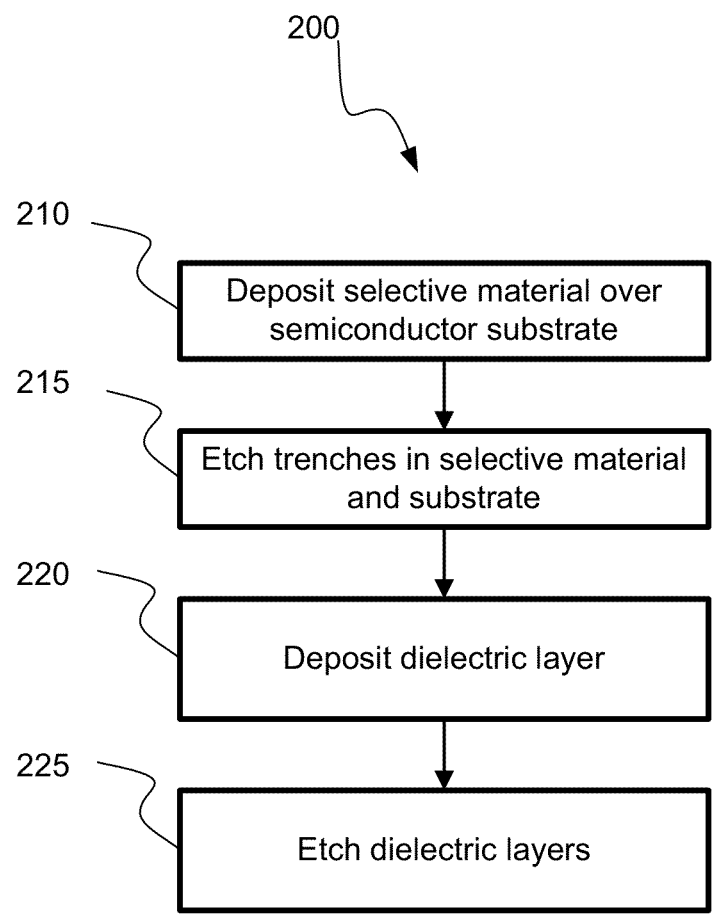
FIG. 2 shows a flowchart of an etch process according to disclosed embodiments.

Referring now to FIG. 2, a method 200 of etching a dielectric material located between sections of a selective material over a semiconductor substrate is described. The method includes depositing 210 a selective material over a semiconductor substrate. The selective material may be any material desired to be maintained while a separate material is removed. For example, and without intending to limit the invention, the selective material may be a polysilicon used as a floating gate in a flash memory cell. Another material, such as a dielectric, may be co-located on a substrate along with the selective polysilicon. The intention in some embodiments may be to remove the dielectric material while maintaining the selective polysilicon. In such a case, the dielectric may be removed in a way that limits the removal or does not remove the polysilicon. This may be performed with particular etching techniques that preferentially remove the dielectric. For example, utilizing dry etchant gases that react with oxides or nitrides but not with the polysilicon provides a way of removing the dielectic while maintaining the selective material. In other embodiments, the selective material is silicon, a deposited metal, a dielectric, or any other material that my be deposited on a substrate in which the intention is to remove significantly less of the selective material during the removal of a separate material.

After the selective material has been deposited, trenches may be etched 215 through the selective material and in some instances the semiconductor substrate. The etching creates isolated sections of the selective material located over the semiconductor substrate that are separated by the etched trenches. The trenches may display high aspect ratios in which the depth of the trench may be significantly greater than its width. Exemplary trenches may have an aspect ratio of about 2:1 or more, about 3:1 or more, about 5:1, about 7:1 or about 10:1 or more, etc.

The methods may further include depositing 220 a dielectric material within the trench. The deposition may include filling the trench completely and depositing sufficient dielectric to cover the selective material, or in other embodiments the deposition may fill the trench partially. The dielectric may be deposited past the level of the substrate so that it at least partially fills between the isolated sections of the selective material. Depending on the characteristics of the trenches, the dielectric material may be deposited by a flowable, or non-flowable method. In some embodiments with narrow and deep trenches, the dielectric may be deposited in a flowable manner in order to limit the likelihood of developing voids. In other embodiments, a higher quality dielectric may be used for improved insulation between the field components. In some embodiments spin-on-glass is used to deposit the dielectric material. In alternative embodiments the dielectric is deposited by a flowable CVD.

In some embodiments multiple dielectric depositions may be performed in order to fill the trench. For example, a liner layer may be deposited within the trenches prior to the trenches being filled with a flowable dielectric. Such a combination may provide the benefits of improved insulation from the liner layer, as well as the improved fill characteristics of a flowable dielectric. Additional examples include depositing the dielectric in a series of steps that include both deposition and etch-back of the dielectric in order to minimize bread-loafing and void formation. An initial layer of dielectric may be deposited in the trench followed by an intermediate etch process to remove dielectric buildup along the top of the trench. After the etching, the remainder of the trench may be filled with a subsequent deposition of dielectric material.

An etching process 225 may be performed after the deposition of the dielectric layer. The etching may include exposing the substrate to a dry etchant gas that removes a portion of the dielectric layer between the isolated sections of the selective material to form a recess. The dry etchant gas may be a mixture of gases that includes a fluorine-containing compound as well as molecular hydrogen. The gases may be flowed separately into the processing chamber in which the substrate resides, and in some embodiments the dry etchant gas is excited by a remote plasma source prior to its being flowed into the process chamber. In some embodiments the dry etchant gas is substantially free of ammonia, which may provide a slower reaction with a higher quantity of fluorine radicals available for reaction. The use of a dry etchant gas that is substantially free of ammonia may produce a recess with a substantially flat corner profile due to the prevented reduction of fluorine radicals into products including ammonium fluoride and ammonium hydrogen fluoride. The dry etchant gas may be completely free of ammonia in order to further prevent the removal of fluorine radicals by the formation of intermediate chemicals including ammonium fluoride and ammonium hydrogen fluoride.

In some depositions the dielectric layers are deposited well above the level of the selective material and an intermediate dielectric removal can be performed. Processes such as chemical mechanical polishing may be utilized to remove excess dielectric. The selective material may be used as the etch stop layer, which may be, for example, a field gate polysilicon or silicon nitride. Once the dielectric has been removed down to the layer of the selective material, the dry etchant may be used to remove the dielectric located between the sections of selective material.

The dielectric located between the sections of selective material may be removed based on the effective field height of the selective material. For example, the dielectric may be etched between about 200 and about 1200 angstrom. Additional examples may have the dielectric etched between about 400 and about 1000 angstrom, between about 600 and about 800 angstrom, etc. Where there are multiple sections of selective material, and multiple regions in between these sections in which dielectric must be removed, the dry etchant gas may provide recesses with cell to cell variation of less than about 10 nm. Exemplary effective field height variation between recess depths intercell is less than about 8 nm, or less than about 6 nm. The dry etchant gas may provide an etch uniformity between cells where deviations between cell recess depth and shape are less than 5%. Differences between cell depth and shape may be less than about 3%, about 2%, about 1.5%, about 1%, about 0.5%, about 0.1%, etc.

The resulting profile of the recess after the dielectric has been removed from between the sections of selective material may have a floor that is defined by the remaining dielectric material in the shallow trench isolation of the substrate. The floor profile may be substantially flat across the dielectric up to the location of where the dielectric material intersects the selective material. This point of intersection may define a corner of the recess, and the corner profile of the dielectric material may be at about a right angle with the selective material. When a right angle is formed between the dielectric material floor and the selective material wall defining the recess, a flat corner profile has been formed. An angle greater than or less than 90° may be formed, in which case the corner profile may be substantially flat. The dielectric may not be completely removed in the corners producing a slight concavity of the dielectric at the recess corner. Although the concavity may not define a perfectly circular cross section, the radius of curvature with the recess sides and floor may be less than about 5 nm. The radius of curvature may be less than about 3 nm, 2 nm, 1 nm, 5 angstrom, 3 angstrom, 2 angstrom, or about 1 angstrom in some embodiments providing a substantially flat corner profile.

The dielectric may be cured following deposition and prior to etching in order to improve the dielectric film quality.

Curing may be carried out by any of the previously discussed methods. The curing may be an anneal, and may be performed at temperatures below about 1000° C. For example, the curing may occur below about 800° C., 600° C., 500° C., 400° C., 300° C., or below about 200° C. Utilizing a flowable dielectric may reduce the thermal budget of the manufacturing processes, and in some cases the processes may be performed below about 600° C., 500° C., 400° C., 300° C., 200° C., or below about 100° C. in order to maintain the flowable dielectric.

In some embodiments an oxide layer known as a tunnel oxide is deposited between the semiconductor substrate and the selective material to ensure isolation of floating gates. The tunnel oxide is deposited prior to the initial deposition of the selective material and trench formation. The dielectric deposited in the trenches and between the sections of the selective material may be etched down to the level of the tunnel oxide. Alternatively, the dielectric material may be etched between the sections of selective material, but is not etched down to the level of the tunnel oxide.

After the dielectric material has been etched from between the sections of the selective material, subsequent manufacturing may occur. An isolation layer may be deposited over the selective layer and in the etched recesses. This isolation layer may provide a liner between, for example, the floating gates and the control gate that can be subsequently deposited. A deposit of another material, such as a metal, dielectric, or some other material may be deposited after the isolation layer has been laid down. The subsequent material may be polysilicon that acts as a control gate in a flash memory cell such as a Nand flash device. A substantially flat corner profile of the etched dielectric recess may enable subsequent integrated passive device layers to be filled inside the trenches that can be a few nanometers in width, for example. When an isolation layer and a subsequent control gate layer are deposited within a recess that has a substantially flat corner profile and/or better cell uniformity, further integration issues may be prevented by providing improved interfaces for IPD scaling.

Figure 3A:
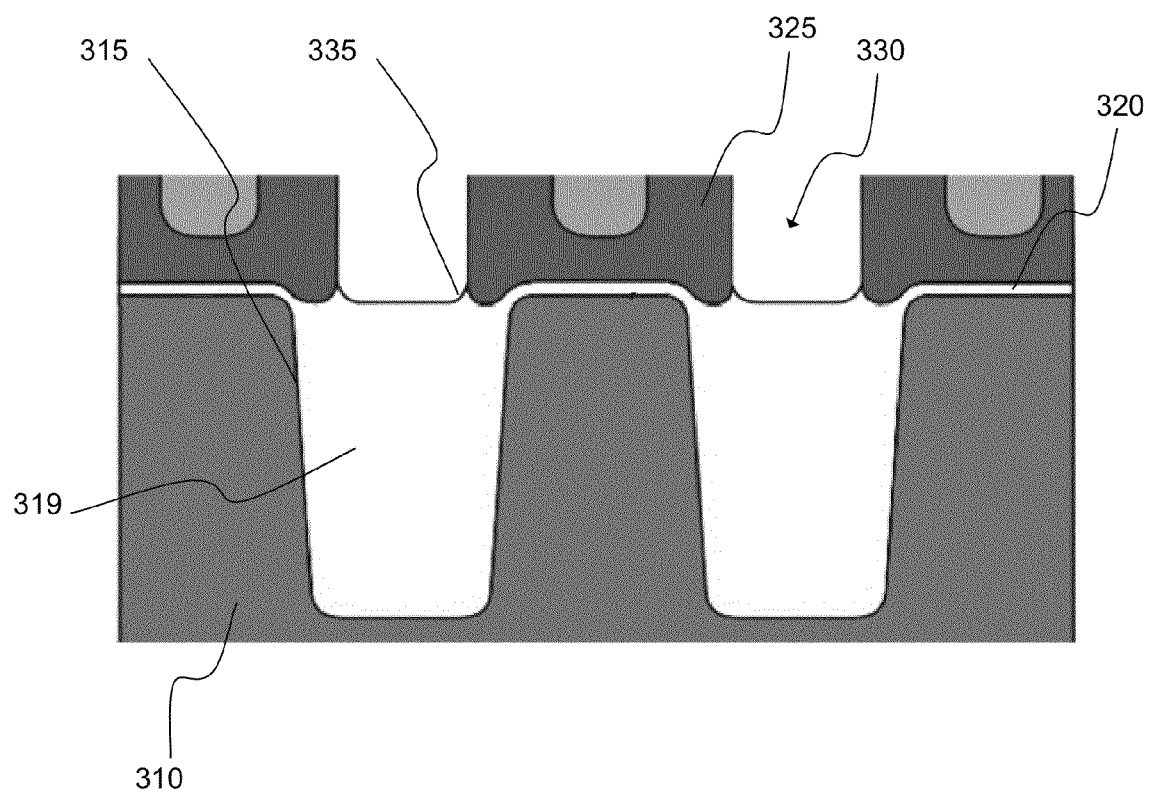
FIG. 3A shows a cross-sectional view of a substrate on which an etch process according to the present methods has been performed.

Turning now to FIG. 3A, a cross-sectional view is shown of a substrate 310 on which an etch process according to the present methods has been performed. Tunnel oxide 320 is deposited between substrate 310 and selective material 325. The selective material 325 may be a metal, a dielectric or oxide, or some other material. Selective material 325 may be polysilicon that is doped or undoped in some embodiments. Trenches 315 are created in the layers and filled with a dielectric material 319. The dielectric material may be flowable initially after deposition, and may be cured subsequent to deposition. The dielectric may then be etched back forming recess cells 330 with corners 335. The etching process may use a dry etchant gas mixture of a fluorine-containing gas and molecular hydrogen, and the dry etchant gas may be substantially free of ammonia. While corners 335 show a slight concavity, other embodiments may have them substantially flat or flat at the interface between the dielectric floor and selective material walls defining the recess cells 330 creating a right angle intersection. The cross-sectional view of FIG. 3A may be an intermediate step in processing a semiconductor device that will include deposition of a subsequent layer of material, such as polysilicon, within the recess cells formed. This subsequent material may be deposited after forming an isolation or liner layer over the selective material and within the recesses. The dielectric layer 319 may include both a liner layer as well as an additional layer of gapfill dielectric.

Figure 3B:
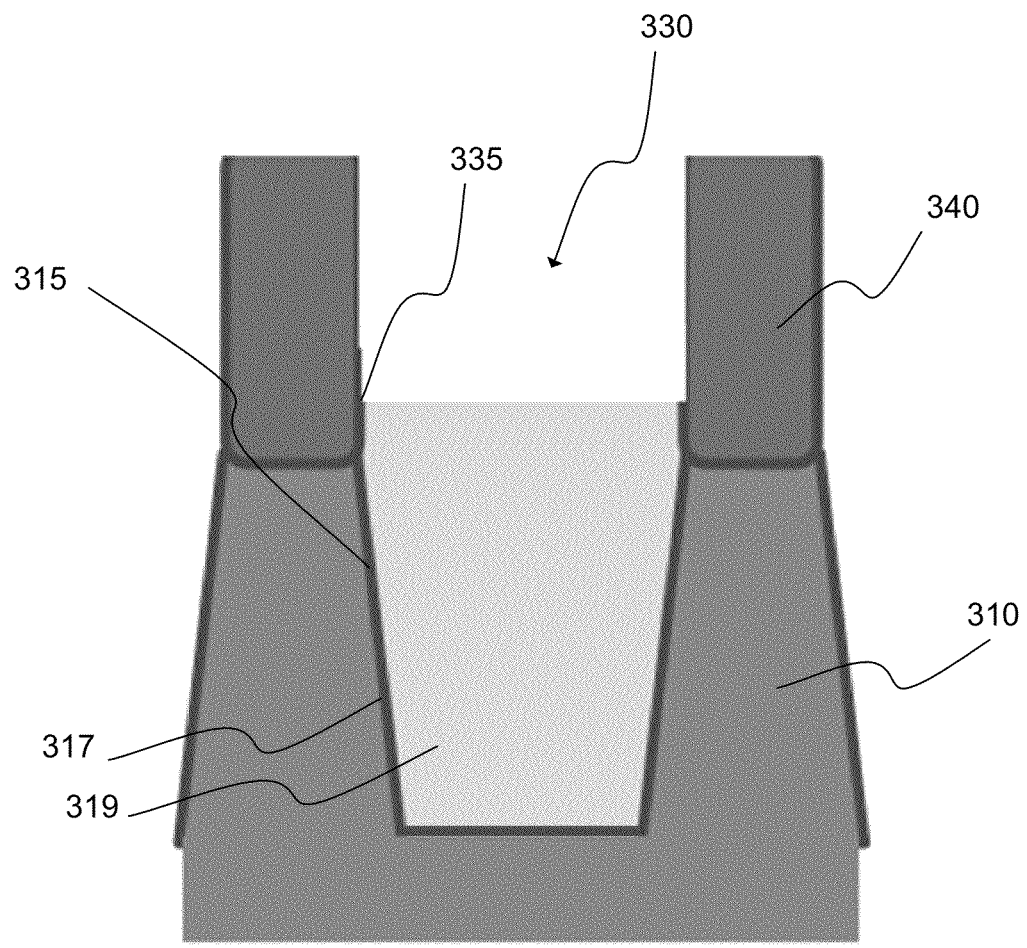
FIG. 3B shows a cross-sectional view of a substrate on which an etch process according to the present methods has been performed.

In FIG. 3B, a cross-sectional view is shown of a substrate 310 on which an etch process according to the present methods has been performed. The substrate 310 has a pad layer 340 deposited prior to forming the trenches 315. After trench formation, a dielectric liner material 317 may be deposited. The liner 317 may be deposited by, for example, an HDP deposition. Subsequently, a dielectric material 319 is deposited over the liner layer 317 within the trench 315. The dielectric material 319 may be initially flowable after deposition, and may be cured subsequent to deposition. The dielectric material 319 may be the same or a different quality and/or density of the dielectric liner layer 317. For example, the liner layer 317 may be of a higher quality than the dielectric material 319.

The dielectric 319 may extend above the pad oxide 340 and may be initially removed down to the layer of the pad oxide with a process such as chemical mechanical polishing. An etching process can be performed in which a dry etchant gas mixture is used to remove the dielectric material 319 and dielectric liner layer 317. The dry etchant gas mixture may include a fluorine-containing gas and molecular hydrogen, and may be substantially free of ammonia, or completely free of ammonia. The dry etchant gas removes the dielectric material 319 and liner layer 317 to produce a recess 330 that includes a corner 335. The corner 335 profile may be substantially flat indicating that the dielectric material 319 and dielectric liner 317 are removed to substantially the same depth. Removal to equivalent depth indicates that the dry etchant gas are substantially insensitive to oxide quality.

EXAMPLES

Comparative examples were made between etch selectivity using an etchant gas mixture with and without ammonia. The etches were conducted on a trench that was first lined with an HDP liner layer and then filled with a flowable oxide. The dielectrics were exposed to dry etchant gas mixtures containing nitrogen trifluoride and molecular hydrogen. In one example, the dry etchant gas also contained ammonia, while in a comparative example the dry etchant gas was substantially free of ammonia. As can be seen in Table I below, the dry etchant gas containing ammonia removes more of the flowable oxide in comparison to an HDP oxide than does the dry etchant gas that is substantially free of ammonia:

TABLE I

ETCH DEPTH OF DRY ETCHANT GAS

| | HDP Oxide Etch Depth (angstrom) | Flowable Oxide Etch Depth (angstrom) | Selectivity of Etching of Flowable Oxide with respect to HDP oxide |
| --- | --- | --- | --- |
| Dry Etchant Gas Containing Ammonia | 114 | 134 | 1.19 |
| Dry Etchant Gas Substantially Free of Ammonia | 114 | 123 | 1.09 |

Figure 4A:
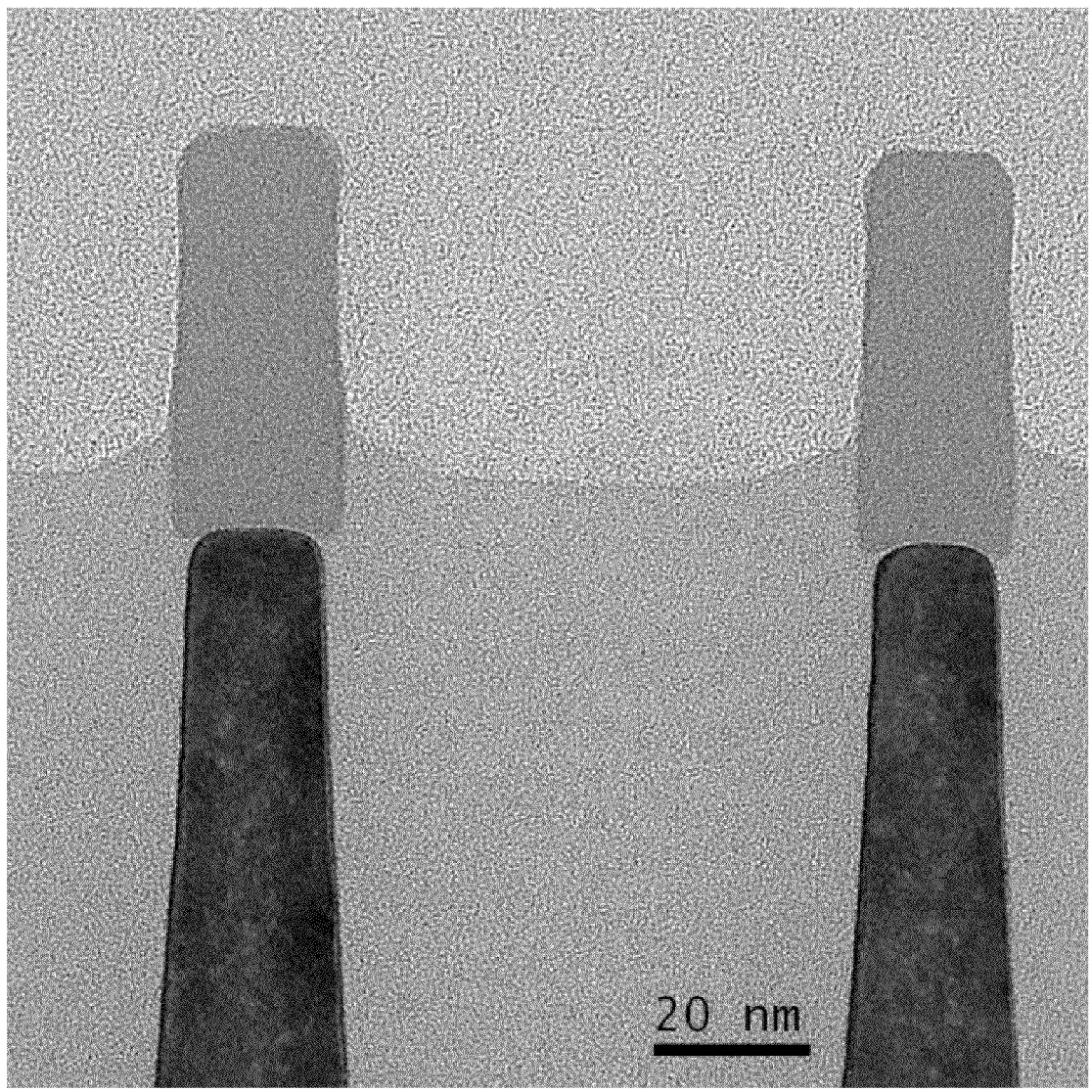
FIG. 4A shows a TEM image of a substrate on which an etch utilizing an ammonia has been performed.
Figure 4B:
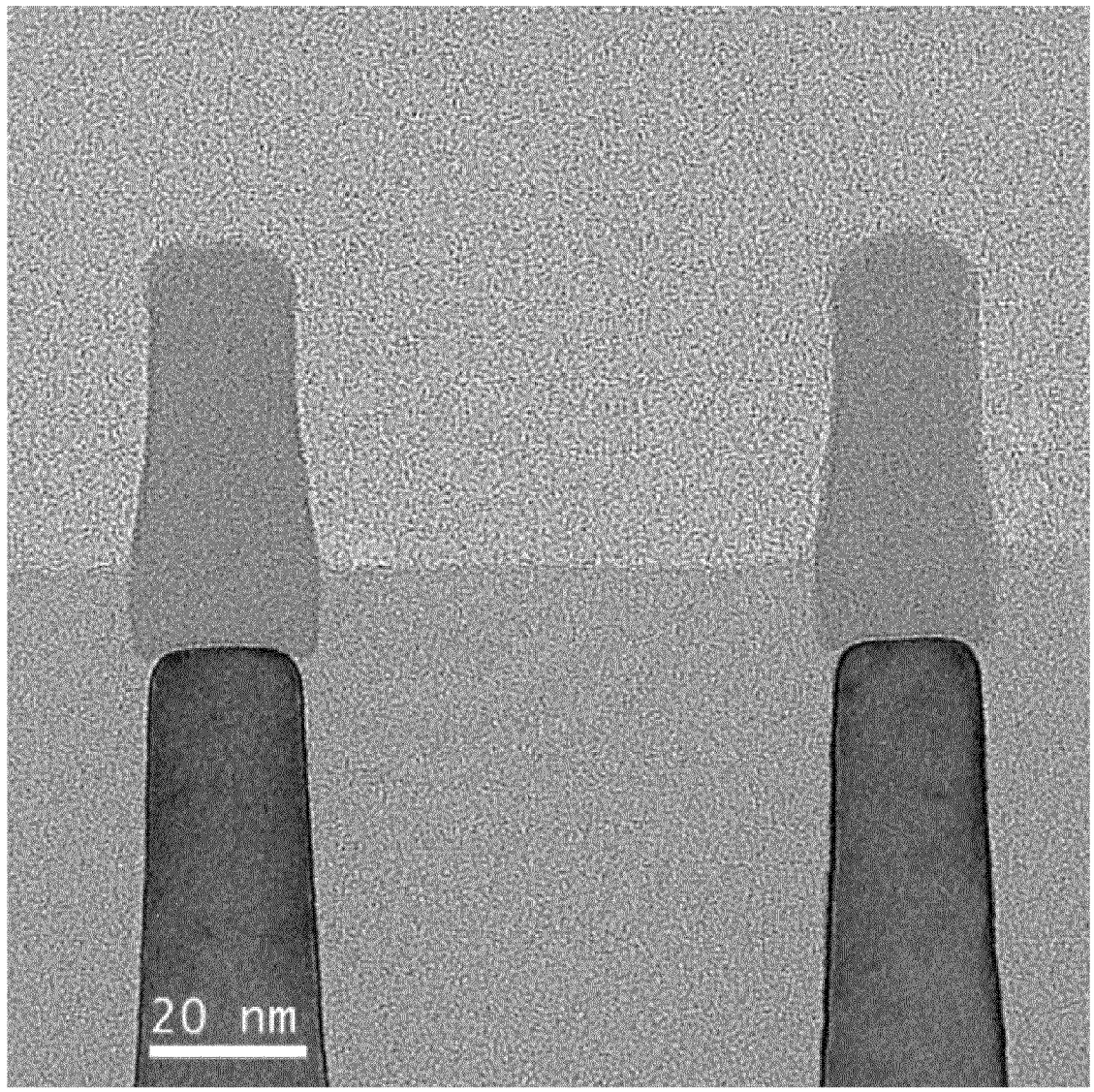
FIG. 4B shows a TEM image of a substrate on which an etch process according to the present methods has been performed.

FIGS. 4A and 4B show comparative TEM images of substrates after an etching has been performed. FIG. 4A shows a substrate on which an etch utilizing an ammonia has been performed. The corner profile as seen in the image shows a concavity indicating that the dielectric was not uniformly removed within the trench. FIG. 4B, however, shows a substrate on which an etch was performed with dry etchant gases that were substantially free of ammonia. As can be seen in the image, the corner profile is substantially flat where the dielectric layer intersects the nitride pad, creating an almost right angle corner profile. The flat corner profile indicates that the dielectric was uniformly removed within the trench.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

It is noted that individual embodiments may be described as a process which is depicted as a flowchart, a flow diagram, or a block diagram. Although a flowchart may describe the method as a sequential process, many of the operations can be performed in parallel or concurrently. In addition, the order of the operations may be rearranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a dielectric material" includes a plurality of such materials, and reference to "the application" includes reference to one or more applications and equivalents thereof known to those skilled in the art, and so forth.

Also, the words "comprise", "comprising", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:

1. A method of etching a recess in a semiconductor substrate, the method comprising:
    forming a dielectric liner layer in a trench of the substrate, wherein the liner layer has a first density;
    depositing a second dielectric layer at least partially in the trench on the liner layer, wherein the second dielectric layer is initially flowable following the deposition, and wherein the second dielectric layer has a second density that is less than the first density of the liner layer;
    exposing the substrate to dry etchant, wherein the etchant removes a portion of the first liner layer and the second dielectric layer to form a recess, wherein the dry etchant comprises a fluorine-containing compound and molecular hydrogen, and wherein an etch rate ratio for removing the first dielectric liner layer to removing the second dielectric layer is about 1:1.2 to about 1:1.

2. The method of claim 1, wherein the first dielectric liner layer comprises a high-density plasma formed silicon oxide layer.

3. The method of claim 1, wherein the second dielectric layer comprises a silicon oxide layer deposited by FCVD.

4. The method of claim 1, wherein the fluorine-containing compound comprises $NF_3$.

5. The method of claim 1, wherein the dry etchant is substantially free of ammonia.

6. The method of claim 1, wherein the recess has a substantially flat corner profile.

7. The method of claim 1, further comprising curing the second dielectric layer after it is deposited.

8. The method of claim 1, wherein the dielectric layers are deposited and etched at a temperature of about 400° C. or less.

9. A method of etching a recess in a semiconductor substrate located in a semiconductor processing chamber, the method comprising:
    forming a dielectric liner layer in a trench of the substrate, wherein the liner layer has a first density;
    depositing a second dielectric layer at least partially in the trench on the liner layer, wherein the second dielectric layer is initially flowable following the deposition, and wherein the second dielectric layer has a second density that is less than the first density of the liner layer;
    flowing a dry etchant through a showerhead positioned within the semiconductor processing chamber; and
    exposing the substrate to the dry etchant, wherein the etchant removes a portion of the first liner layer and the second dielectric layer to form a recess, wherein the dry etchant comprises a fluorine-containing compound and molecular hydrogen, and wherein an etch rate ratio for removing the first dielectric liner layer to removing the second dielectric layer is about 1:1.2 to about 1:1.

10. The method of claim 9, wherein the first dielectric liner layer comprises a high-density plasma formed silicon oxide layer.

11. The method of claim 9, wherein the second dielectric layer comprises a silicon oxide layer deposited by FCVD.

12. The method of claim 9, wherein the fluorine-containing compound comprises $NF_3$.

13. The method of claim 9, wherein the dry etchant is substantially free of ammonia.

14. The method of claim 9, wherein the recess has a substantially flat corner profile.

15. The method of claim 9, further comprising curing the second dielectric layer after it is deposited.

16. The method of claim 9, wherein the dielectric layers are deposited and etched at a temperature of about 400° C. or less.

* * * * *